United States Patent
Thirunavukarasu et al.

(10) Patent No.: US 8,584,074 B1
(45) Date of Patent: Nov. 12, 2013

(54) TESTING TO PRESCRIBE STATE CAPTURE BY, AND STATE RETRIEVAL FROM SCAN REGISTERS

(75) Inventors: Senthil Arasu Thirunavukarasu, Bangalore (IN); Vivek Chickermane, Ithaca, NY (US); Shaleen Bhabu, New Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 436 days.

(21) Appl. No.: 12/987,348

(22) Filed: Jan. 10, 2011

Related U.S. Application Data

(63) Continuation of application No. 11/953,227, filed on Dec. 10, 2007, now Pat. No. 7,886,263.

(51) Int. Cl.
*G06F 17/50* (2006.01)
*G06F 11/22* (2006.01)

(52) U.S. Cl.
USPC .......................................... 716/136; 716/100

(58) Field of Classification Search
USPC ................................................ 716/100, 136
See application file for complete search history.

(56) References Cited

U.S. PATENT DOCUMENTS

| | | | |
|---|---|---|---|
| 7,693,676 B1 | 4/2010 | Keller et al. | |
| 7,958,479 B2 * | 6/2011 | Chakraborty et al. | 716/114 |
| 2006/0123306 A1 * | 6/2006 | Whetsel | 714/744 |
| 2008/0065939 A1 * | 3/2008 | Whetsel | 714/727 |
| 2008/0256497 A1 | 10/2008 | Wohl et al. | |
| 2009/0132976 A1 | 5/2009 | Desineni et al. | |
| 2009/0144594 A1 * | 6/2009 | Chakraborty et al. | 714/732 |
| 2010/0017760 A1 | 1/2010 | Kapur et al. | |
| 2010/0064271 A1 | 3/2010 | Chen | |
| 2010/0083199 A1 | 4/2010 | Wohl et al. | |

OTHER PUBLICATIONS

S Mitra et al., "X-Tolerant Test Response Compaction," IEEE Design and Test of Computers, Special Section on the 2005 International Test Conference, Nov.-Dec. 2005.
P.Wohl et al., "Efficient Compression and Application of Deterministic Patterns in a Logic BIST Application Architecture," Proc. 40th Design Automation Conf. (DAC '03), ACM Press, 2003, pp. 566-569.
P.Wohl et al., "X-Tolerant Compression and Application of Scan-ATPG Patterns in a BITS Architecture", Proc. International Test Conference (ITC '03), IEEE Press, 2003, pp. 727-736.
Rajski et al., "Embedded Deterministic Test for Low Cost Manufacturing Test", Proc. International Test Conference (ITC '02), IEEE Press, 2002, pp. 301-310.
V.Chickernriane et al., "Channel Masking Synthesis for Efficient On-Chip Test Compression", Proc. International Test Conference (ITC '04), IEEE Press, 2004, pp. 452-461.
Encounter Test Synthesis User Guide, Product Version 6.2, Feb. 2007, pp. 233-260.

* cited by examiner

*Primary Examiner* — Thuan Do
*Assistant Examiner* — Magid Dimyan
(74) *Attorney, Agent, or Firm* — Rosenberg, Klein & Lee

(57) ABSTRACT

State retention cells of a test circuit embedded in an electrical circuit are interconnected to form one or more scan chains. The scan chains are interconnected so that unknown states, or X-states, are shifted through the scan chains in an order other than the order in which the states were captured by the state retention cells of the scan chain. Such reordering of response states in individual scan chains may be used to align the X-states across multiple scan chains to achieve higher test compression scan register circuit testing.

20 Claims, 10 Drawing Sheets

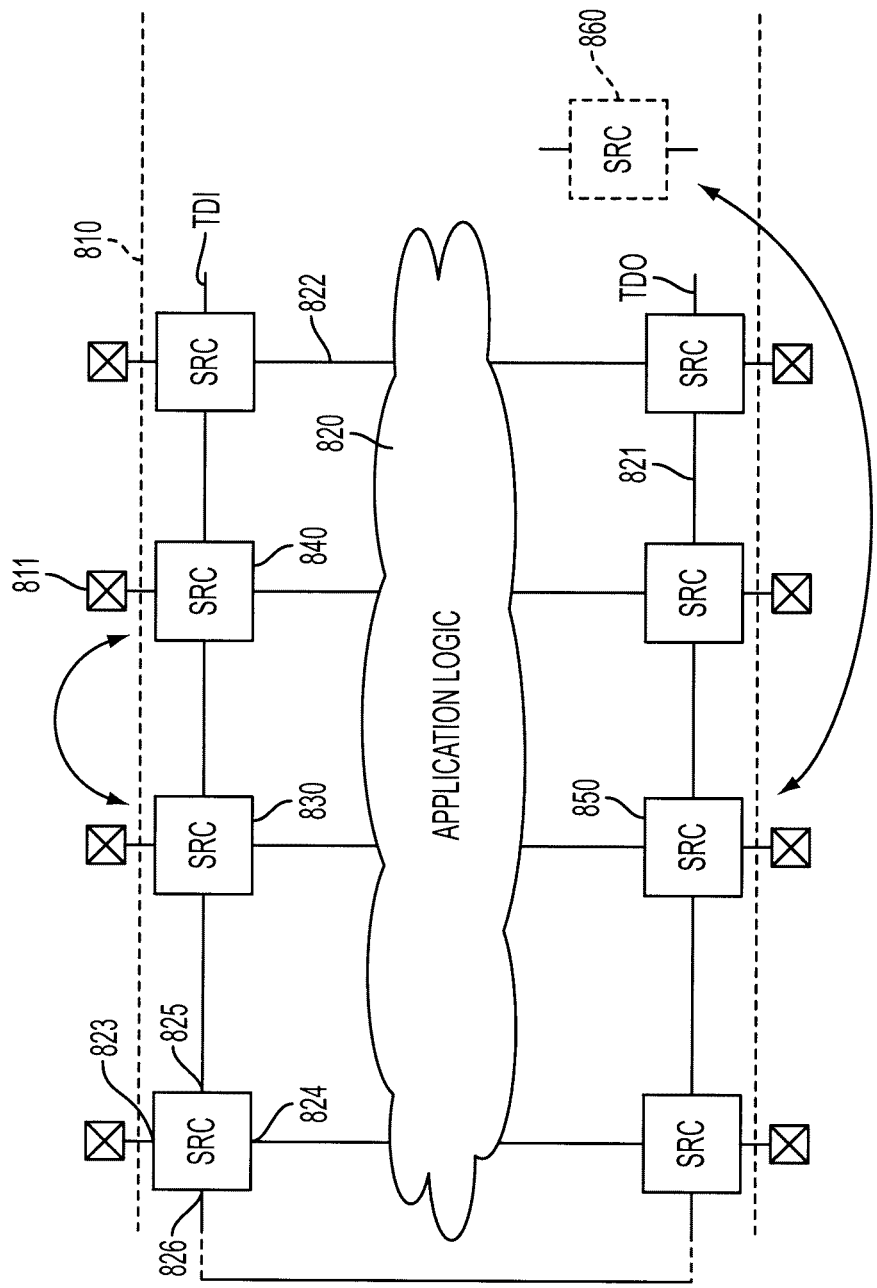

though specifically illustrated by package
TESTING TO PRESCRIBE STATE CAPTURE BY, AND STATE RETRIEVAL FROM SCAN REGISTERS

RELATED APPLICATIONS

This application is a Continuation patent application of co-pending application Ser. No. 11/953,227 filed on 10 Dec. 2007. The entire disclosure of the prior application Ser. No. 11/953,227, from which an oath or declaration is supplied, is considered a part of the disclosure of the accompanying Continuation application and is hereby incorporated by reference.

BACKGROUND OF THE INVENTION

1. Field of the Invention

The present general inventive concept most directly relates to integrating test systems into electrical circuits. More specifically, the inventive concept relates to designing a test system to embed in an electrical circuit at circuit design time to prescribe the manner by which test response states are obtained by, and subsequently retrieved from scan registers, or "scan chains," of the test system at test time. Scan chains are constructed so that test response states may be captured by the scan chains in a manner that corresponds to the test points of the electrical circuit, and may be retrieved from the scan chains in a manner independent from the manner by which the response states were captured to correspond to predetermined analysis requirements of the test system.

2. Description of the Related Art

Continuing advances in integrated circuit technology, coupled with steady progress in electronic circuit and circuit packaging design over the past several decades, has necessitated that considerable engineering resources be devoted to embedding test systems into primary circuitry. The concept of integrating test circuitry as part of the total circuit design follows what is generally referred to as the Design for Testing (DfT) paradigm. Advantageously, DfT techniques allow conducting quality control tests during one or more stages of the circuit manufacturing process, and even in the field, where previous techniques using, for example, traditional circuit probe systems cannot access the full set of desired circuit test points. Additionally, proper DfT techniques adhere to a doctrine that the test circuit be designed and constructed such that excessive impact on the form, fit and function of the primary circuit in which it resides is avoided.

One of the more common DfT techniques implements the so-called "boundary scan architecture," which provides in-circuit hardware to serially input test data into a circuit-under-test (CUT), and to subsequently retrieve response data by serially shifting the data out of the CUT. Implementing the serial shifting of the test pattern data, as well as the response pattern data, requires some additional hardware, but allows data exchange between the CUT and, for example, automatic test equipment (ATE), without a large number of additional pins needed on the circuit package. The Institute of Electrical and Electronics Engineers (IEEE) Joint Test Action Group (JTAG) standard 1149.1, "Standard Test Access Port and Boundary Scan Architecture," is a ubiquitous implementation of such serial scan testing.

In FIG. 1, there is illustrated a typical circuit configuration 110 implementing a boundary scan register 150. The boundary scan register 150 is formed from a plurality of state retention cells, representatively illustrated by state retention cells 125, 127, 128, and 129, serially interconnected, or "stitched", into one or more "scan chains" 152. Typically, each state retention cell 125, 127, 128, 129 is situated between the application logic 120a-120d, such as in the circuit packages 115a-115b, and input and output ports thereof, such as package pins, representatively illustrated by package pin 126. The scan chain 152 is defined by the state retention cells, such as state retention cells 125, 127, 128, 129, interconnected from a test data in (TDI) terminal 154 to a test data out (TDO) terminal 155. Test pattern data and the corresponding response data are respectively entered into and retrieved from the scan chain 152 by serial shifting. Typically, the test pattern is serially entered into the scan chain 152 via the TDI terminal 154, corresponding response states are then captured at receiving state retention cells 128 and 129, and finally the response data are serially transferred out of the circuit via the TDO terminal 155.

In early implementations of the IEEE standard 1149.1, the boundary scan test ascertained only whether the various circuit packages, e.g., packages 115a-115b, were interconnected properly. To do so, response states corresponding to various test patterns would be determined a priori according to a circuit model. During testing, a state "1" would be set in, for example, state retention cell 127 as part of the test pattern, and a corresponding response state would be captured by state retention cells 128 and 129, which would be compared with modeled response states, i.e., "1," to determine whether the interconnecting circuit traces 140 and 142 were undamaged and conducting properly.

Extensions to the foregoing boundary scan design now provide mechanisms to test functional circuitry as well, such as logic. Such testing of circuitry has become essential as manufacturing and design technologies produce denser circuits having a very large number of gates in a very small area. Similar to the interconnection testing by boundary scan, the functional testing proceeds by shifting test pattern data into a scan register, capturing the results on the opposite side of the logic, and shifting the test response data out of the scan register to be analyzed against modeled response data.

Responsive to the increasing complexity of modern circuitry, and the corresponding increase in test time, test compression techniques have been developed that include multiple, shorter scan chains incorporated into the CUT, as opposed to a single scan chain in a full scan implementation. One such compression technique is illustrated in FIG. 2, where the CUT 210 has incorporated therein a plurality of scan chains 230-1 to 230-n. The scan chains 230-1 to 230-n are respectively coupled to bidirectional pins 220-1 to 220-n, where the test data are input as test pattern vectors and corresponding response signature data is output. The states captured in the scan chains 230-1 to 230-n are processed at a multiple-input signature register (MISR) 240, which accumulates scan chain data over several clock cycles to produce a response signature corresponding to an applied test pattern.

In certain cases, such as, for example, in complex logic circuits, not all response states are modeled for a set of test pattern vectors. When a response state is unknown at test time, referred to as an "X-state," its value at test time is preferably ignored. However, in certain test systems, the response analysis system is such that the X-states cannot simply be ignored. For example, in test systems using an MISR, X-states can corrupt the response signature to the extent that no determination can be made as to whether the circuit is correctly interconnected and/or operational. Moreover, X-states are typically interspersed among response data that have been modeled, and thus processing the response data in the presence of X-states requires additional measures that consume valuable circuit area and/or increases the time to test completion.

As illustrated in FIG. 3, response data sequences 330-1 to 330-n contain data as serially shifted from respective scan chains in the illustrated "DATA OUT" direction. A response vector, as used herein, refers to a plurality of response bits captured by respective state retention elements in a corresponding capture cycle and shifted out of respective scan chains concurrently. Representative response vectors are illustrated at response vectors 310, 312, and 314. Each of the response vectors 310, 312, 314 eventually arrives during an evaluation cycle at a response analyzer (not illustrated) as an evaluation vector 320.

The data sequences 330-1 to 330-n may contain unknown response states, i.e., X-states, representatively illustrated at X-state 315, and the response analyzer must produce meaningful results in the presence of those X-states. In systems using an MISR, for example, the X-states must be processed prior to entering the MISR to avoid corrupting the analysis. For example, each evaluation vector 320 containing an X-state may be masked at the input of the response analyzer, and vectors not containing an X-state, such as would result from response vectors 312 and 314, are allowed unmasked entry into the response analyzer. However, as is illustrated in FIG. 3, such masking severely depletes the number of usable evaluations vectors 320 by which to form a response signal, such as a response signature provided by an MISR, since only evaluation vectors corresponding to response vectors 312 and 314 are without X-states therein.

Several techniques have been developed to implement X-tolerant test response compression. Generally, such techniques include the addition of hardware in the test circuit, thereby increasing the circuit area consumed by the test circuit that could otherwise be used for functional circuitry or to decrease the size of the overall circuit. In light of the shortcomings of the existing X-state handling techniques, the need has been recognized for embedding serially accessed registers in a circuit to be tested, such as in scan testing systems, to accommodate efficient X-state handling according to the implemented analysis technique without an excessive penalty incurred by additional circuitry and/or additional test time.

SUMMARY OF THE INVENTION

The present general inventive concept provides scan chain construction of state retention cells so that X-states captured thereby can be retrieved therefrom in an order other than the order in which the state retention cells are physically positioned to capture data from the CUT. Such scan chain construction may be used to align captured X-states in common response vectors, which can each be disregarded or processed in a single evaluation cycle.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of integrating a test system into an electrical circuit. A plurality of state retention cells are positioned at fixed locations in a layout of the electrical circuit to capture respective response states thereat. The states are captured in a spatial order relative one to another defined by the relative positions of the state retention cells that captured the states. Locations of unknown response states captured by the corresponding state retention cells in response to a test pattern input thereto are located in the spatial order of response states. The state retention cells are interconnected such that the unknown response states are retrieved from the interconnected state retention cells in an order other than the spatial order of the state retention cells in which they were captured.

The foregoing and/or other aspects and utilities of the present general inventive concept may also be achieved by providing a test circuit integration system. A storage unit stores therein circuit layout data defining a layout of an electrical circuit. The circuit has a plurality of state retention cells in a predetermined spatial order incorporated therein. An analysis unit determines a modeled response state at each of the state retention cells responsive to a test pattern. A routing engine defines locations in the layout of geometrical paths that interconnect the state retention cells such that the state retention cells capturing unknown ones of the modeled response states are serially connected in an order other than the spatial order.

The foregoing and/or other aspects and utilities of the present general inventive concept may also be achieved by providing an electrical circuit having state capture elements and other state capture elements to respectively capture response states in parallel one to another. An interconnection network forms serial shift registers respectively from the state capture elements and the other state capture elements. Response states are captured by state capture elements in respective ones of the shift registers in a first alignment with respect to one another and is shifted out of the ones of the shift registers in a second alignment with respect to one another.

The foregoing and/or other aspects and utilities of the present general inventive concept may also be achieved by providing a computer readable medium having encoded thereon processor instructions that, when executed by a processor, performs a method of integrating a test system into an electrical circuit. The processor instructions are executed to position a plurality of state retention cells at fixed locations in a layout of the electrical circuit to capture respective response states thereat in a spatial order relative one to another defined by the relative position thereof. Unknown response states captured by the corresponding state retention cells responsive to a test pattern input thereto are located among the response states in the order thereof. The processor executes processing instructions that interconnect the state retention cells one with another such that the unknown response states are retrieved from the interconnected state retention cells in an order other than the spatial order.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIGS. 8A-8B are schematic block diagrams illustrating state retention cell reordering in accordance with an exemplary embodiment of the present general inventive concept.

DETAILED DESCRIPTION OF THE PREFERRED EMBODIMENTS

Figure 1:
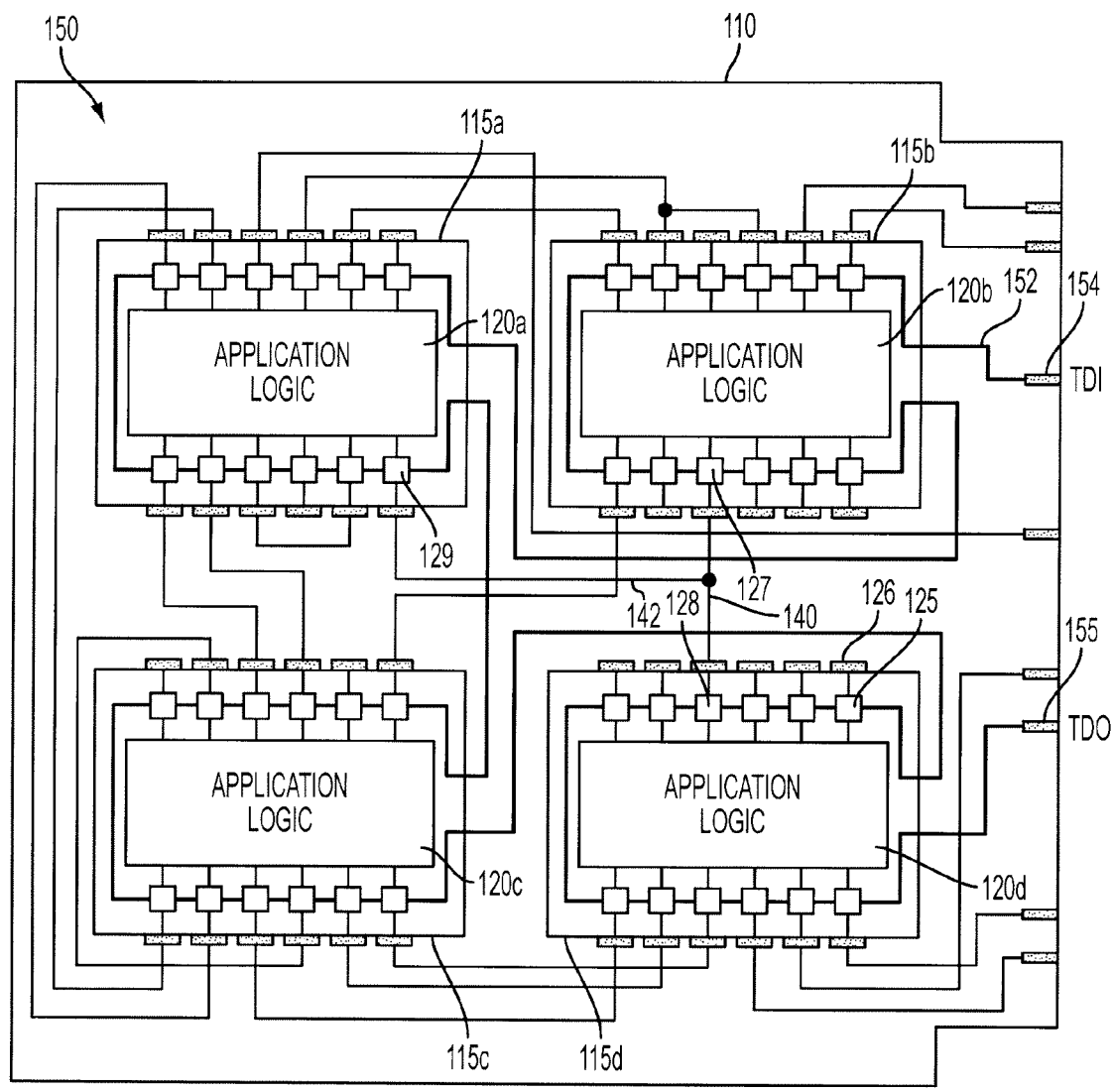
FIG. 1 is a schematic block diagram illustrating a conventional boundary scan chain across multiple components.
Figure 2:
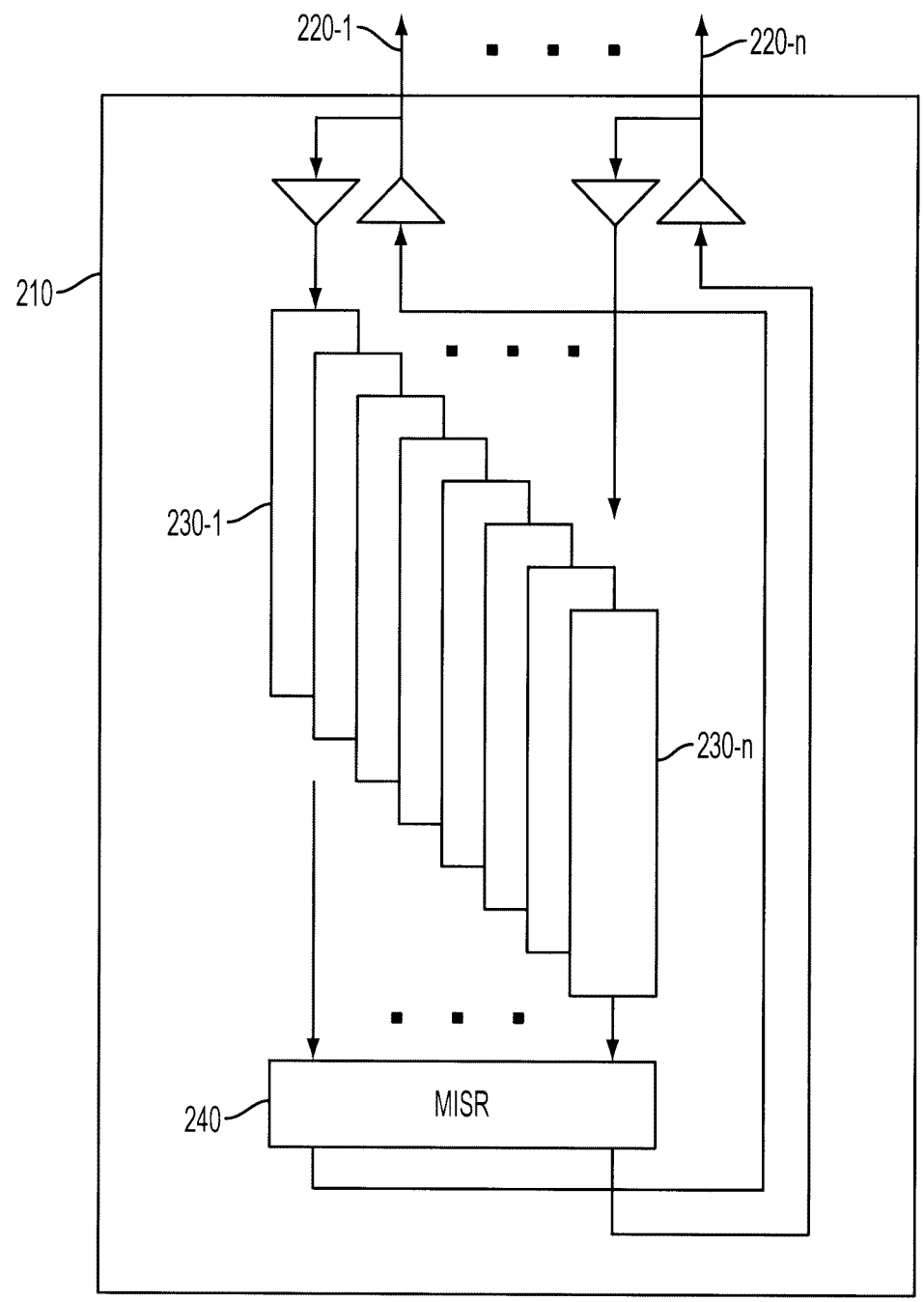
FIG. 2 is a schematic block diagram illustrating a conventional test compression configuration using multiple scan chains and an MISR.
Figure 3:
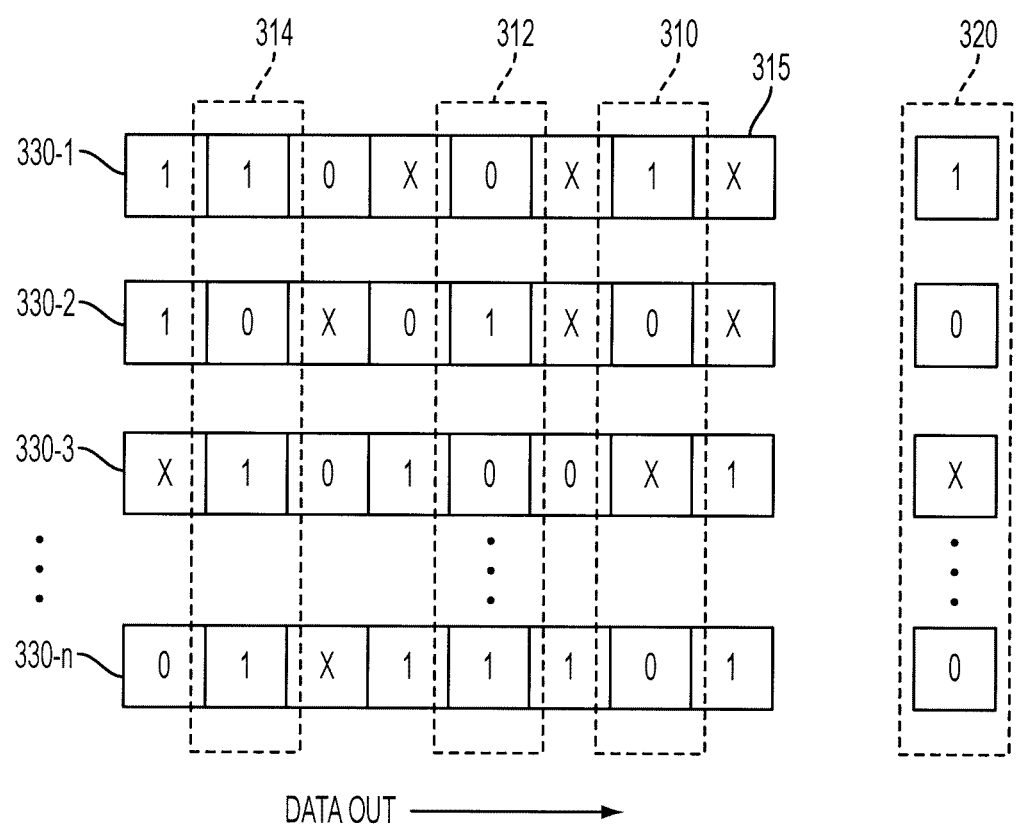
FIG. 3 is a diagram illustrating an exemplary impact of unknown response data in conventional scan chains.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 4:
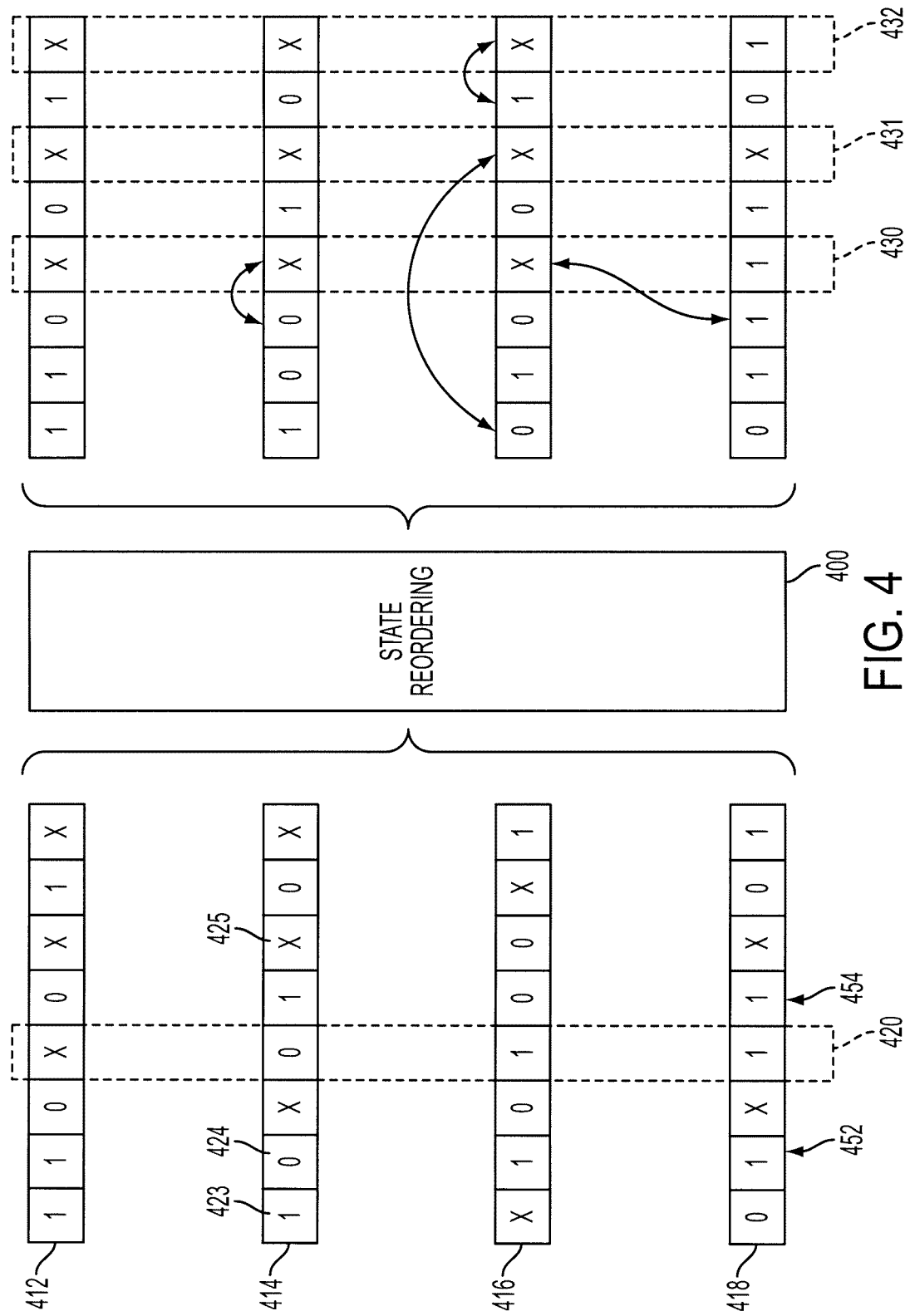
FIG. 4 is a diagram illustrating an exemplary embodiment of the present general inventive concept.

FIG. 4 illustrates a simplified embodiment of the present general inventive concept to demonstrate and describe various elements and operations thereof by way of a generalized implementation. Implementation details of certain embodiments of the present general inventive concept are described below by way of more specific functional components. As is illustrated in FIG. 4, one or more data streams 412-418, which may be serially retrieved from respective chains of interconnected state retention cells coupled to a CUT, contain known response states, such as illustrated at states 423 and 424, and unknown response states, such as illustrated at state 425. It is to be understood that while the unknown states are represented by an "X," the states in the response data take on specific values, although those values are not known at test time. The response states 423-425 are ordered in the data streams 412-418 according to a manner in which states were captured, such as the physical location in a circuit of a state retention cell that captured the state. When more than one stream is formed of the states 423-425, the states may be aligned across streams in response vectors, such as illustrated at response vector 420, to be evaluated or to contribute to an evaluation of the CUT. Prior to being evaluated, and regardless of the order in which the states 423-425 were captured, the streams are reordered according to the present general inventive concept, as generally illustrated at state reordering block 400, to advantageously relocate the unknown states. For example, as illustrated in FIG. 4, states may be reordered in the retrieved data of a single stream, such as stream 414, and/or multiple unknown states may be reordered to be aligned across multiple streams, such as streams 412-418, in common evaluation vectors 430-432. The arrows in FIG. 4 illustrate exemplary state reordering carried out through swapping an X-state from one position in any of the streams 412-418, to another position within the same or other streams 412-418.

Figure 5A:
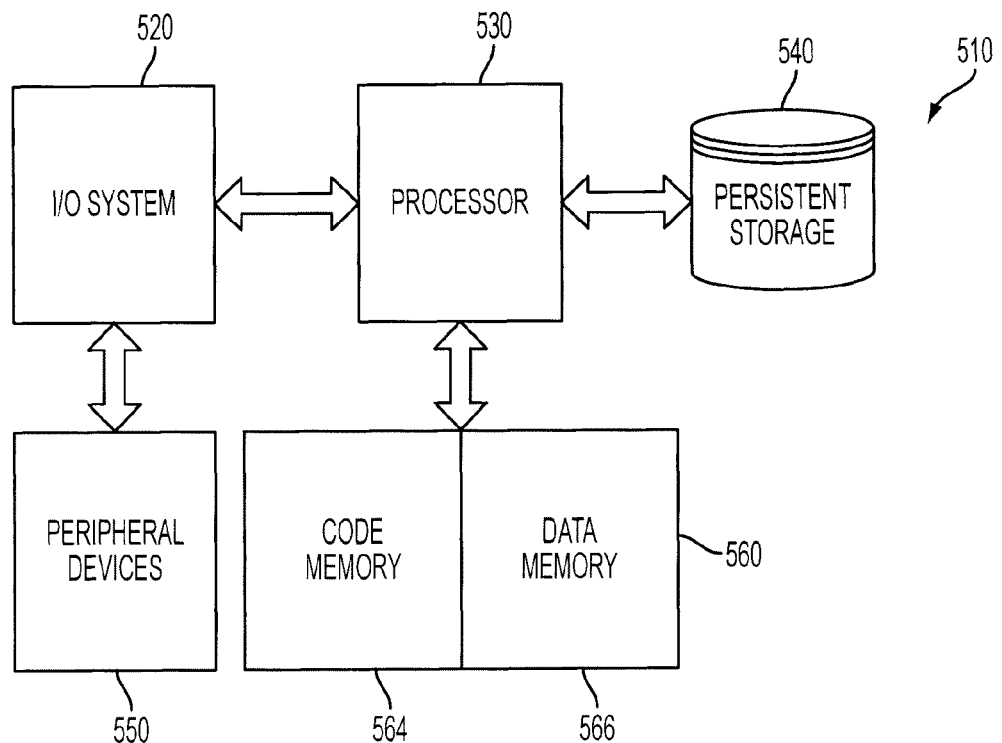
FIGS. 5A-5B are schematic block diagrams illustrating exemplary system configurations in accordance with the present general inventive concept.

FIG. 5A illustrates an exemplary embodiment of a system configuration suitable to practice the present general inventive concept. An exemplary data processing apparatus 510 includes an input/output (I/O) system 520, through which the data processing apparatus 510 may communicate with peripheral devices 550, and/or with external network devices (not illustrated). The exemplary data processing apparatus 510 of the embodiment illustrated in FIG. 5A includes a processor 530 to direct the interoperation of the components of the data processing apparatus 510, and to execute processing instructions that implement various functional modules, such as those described below with reference to FIG. 5B. Embodiments of the present general inventive concept are not limited to a particular hardware configuration or instruction set architecture of the processor 530, and may be configured by numerous structures that perform equivalently to those illustrated and described herein. Moreover, it is to be understood that while the processor 530 is illustrated as a single component, certain embodiments of the present general inventive concept include distributed processing implementations through multiple processing elements. The present general inventive concept is intended to embrace all such alternative implementations, and others that will be apparent to the skilled artisan upon review of this disclosure.

A storage unit 560 may be utilized to store data and processing instructions on behalf of the exemplary data processing apparatus 510 of FIG. 5A. The storage unit 560 may include multiple segments, such as a code memory 564 to maintain processor instructions to be executed by the processor 530, and data memory 566 to store data, such as data structures on which the processor 530 performs data manipulation operations. The storage unit 560 may include memory that is distributed across components, to include, among others, cache memory and pipeline memory.

The data processing apparatus 510 may include a persistent storage system 540 to store data and processing instructions across processing sessions. The persistent storage system 540 may be implemented in a single persistent memory device, such as a hard disk drive, or may be implemented in multiple persistent memory devices, which may be interconnected by a communication network.

It is to be understood that although the functional compartmentalization of the exemplary embodiment of FIG. 5A facilitates an understanding of the present general inventive concept through descriptions thereof, such configuration is not essential to practice the present general inventive concept. Elements other than those shown and described may be substituted therefor, functionality portrayed as carried out in multiple elements may be combined into a single component, and elements described as discrete may be distributed across multiple components. Indeed, numerous variations, alternatives and modifications will become apparent to the skilled artisan upon review of this disclosure and the present general inventive concept is intended to encompass such alternative configurations.

Figure 5B:
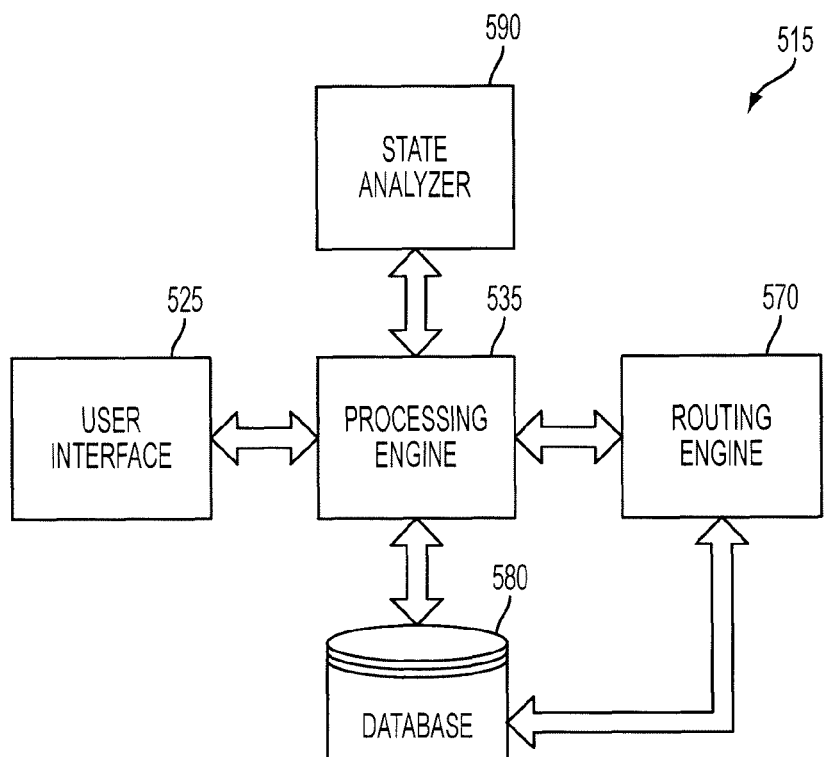

FIG. 5B illustrates an exemplary configuration of functional components suitable to practice certain embodiments of the present general inventive concept. The exemplary system illustrated in FIG. 5B may be implemented through processing instructions executed on the processor 530, and in cooperation with other components illustrated in FIG. 5A, form an exemplary circuit design system 515 on the exemplary data processing apparatus 510 illustrated in FIG. 5A. It is to be understood that the configuration illustrated in FIG. 5B may be implemented as one or more subsystems of an Electronic Design Automation (EDA) system.

The exemplary circuit design system 515 includes a processing engine 535 to perform operations that, among other things, coordinate the interoperation of functional components, and to perform various computations. For example, as will be described in more detail below, the processing engine 535 may determine which of the states in various scan chains are to be reordered and how such states are to be reordered. The exemplary processing engine 535 may also generate mask patterns, which are used in a circuit test process subsequent to the final interconnection of the CUT. The processing engine 535 may also perform operations to maintain circuit layout data of a design in progress and produce data to implement a circuit design in a physically embodied form.

The circuit design system 515 may also include a database 580 to persistently store data corresponding to design elements, such as electronic component libraries, geometric shape data from which to form geometric traces to interconnect terminals of components in a design, and other data to define an electrical circuit in a manner that can be produced through a physical embodiment. The present general inventive concept is not limited by the format or specific content of the data stored in the database 580, and any suitable circuit data that can be manipulated through processing instructions on a processor, such as the processor 530, and then be subsequently provided in a format to physically embody the circuit, may be used with certain embodiments of the present general inventive concept.

The exemplary user interface 525 provides user access to the functions of the circuit design system 515. The user interface 525 may allow the user to place circuit components, to enter design criteria, such as routing constraints and design rules, to manually perform operations, such as editing the component placement and other circuit data, and routing when the circuit design system 515 is unable to determine a solution automatically, and other operations, such as to maintain and access a file system. The user interface may be a graphical user interface, however, the present general inventive concept is not limited by the implementation details thereof.

As is illustrated in FIG. 5B, the circuit design system 515 includes a routing engine 570. The exemplary routing engine 570 is a pathfinding system that determines geometric paths of conductive traces in the circuit design from a terminal of one circuit element to a terminal of another circuit element for each interconnection specified in the circuit design. The routing engine 570 may include a topological router, which determines paths through the circuit layout without regard to the various physical parameters of the traces, and a geometrical router, which establishes the interconnections according to the specified shape and size thereof through placement of geometrical trace data maintained in a database, such as the exemplary database 580 of FIG. 5B. Embodiments of the present general inventive concept are not limited to a particular routing engine implementation, and the implementation details of the routing engine 570 as they are relevant to the exemplary embodiments of the present general inventive concept will be apparent to the skilled artisan from the description below.

Figure 6:
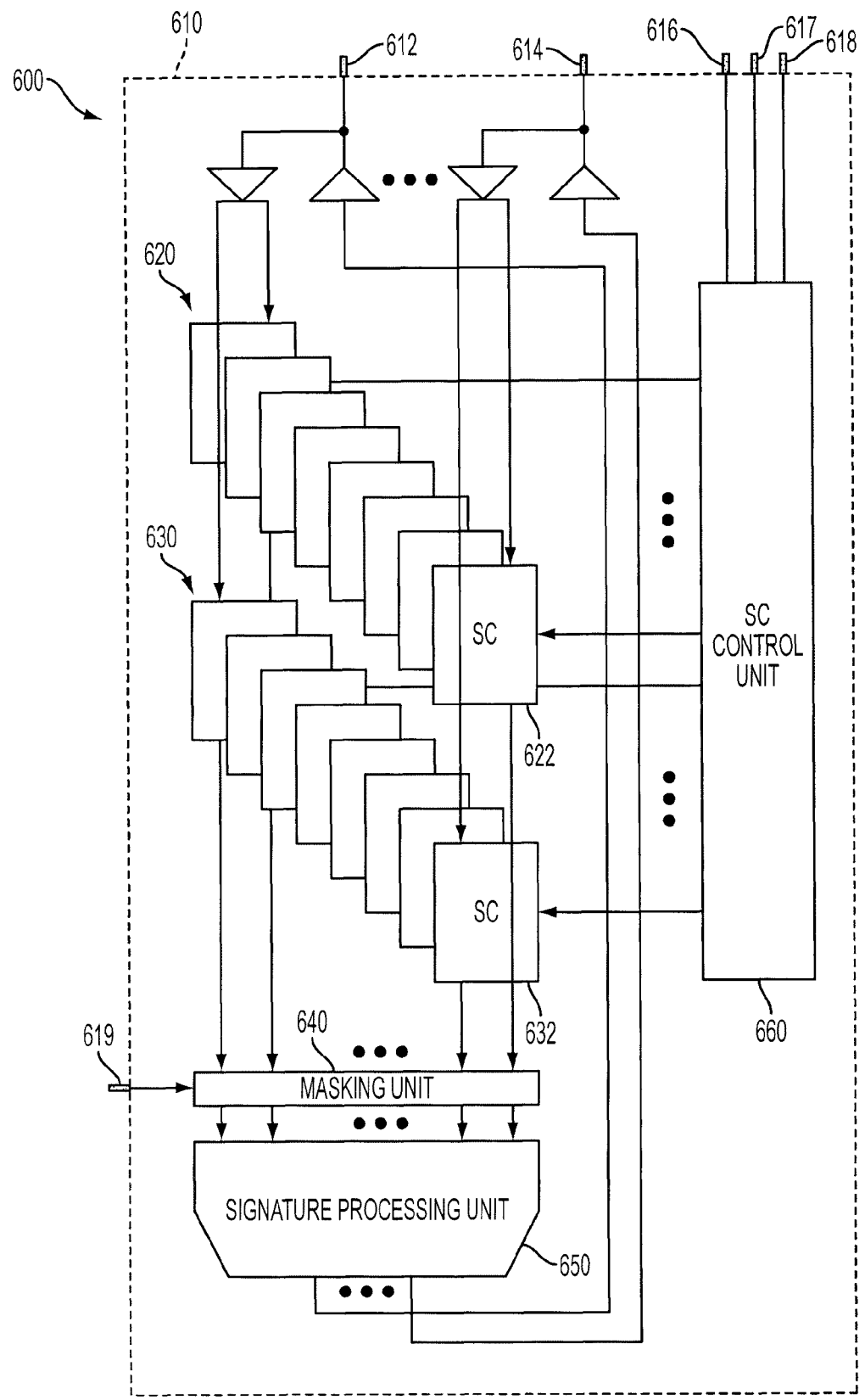
FIG. 6 is a schematic block diagram illustrating an exemplary integrated test system in accordance with the present general inventive concept.

FIG. 6 illustrates an exemplary test circuit 600 in accordance with certain embodiments of the present general inventive concept. The diagram of FIG. 6 illustrates various exemplary components that may be embedded within a CUT, and the CUT in which the exemplary test circuit 600 is embedded is not illustrated in order to avoid obscuring the details of the drawing. Further, the diagram of FIG. 6 should not be construed as a layout of the test circuit 600, but is a block diagram to illustrate certain operational details of the test circuit 600 so that the present general inventive concept can be appreciated.

The exemplary test circuit 600 of FIG. 6 may be an integrated circuit module within a circuit package defined by a circuit boundary 610, or may be one of many circuits within a larger integrated circuit module, where certain circuits in the integrated module, such as the circuit illustrated in FIG. 6, is bound by a corresponding circuit boundary 610. As used herein, the circuit boundary 610 defines a region in which the CUT enclosed thereby is not physically accessed during testing. The present general inventive concept is not limited to a physical embodiment of the CUT or the test circuit 600. For example, the test circuit 600 may be distributed across multiple integrated circuit packages on a printed circuit board, or may be several circuit modules within a single integrated circuit package.

The exemplary test circuit 600 may be electrically accessed through a plurality of pins 612-619 extending from the circuit boundary 610. Pins 612 and 614 are representative bidirectional scan ports to provide serial test data into scan chains, representatively illustrated by scan chains 622 and 632, of respective scan chain groups, representatively illustrated by scan chain groups 620 and 630, and to retrieve a corresponding bit of a response signature from the signature processing unit 650. In the exemplary embodiment of FIG. 6, there is one bidirectional pin 612, 614 for each scan chain 622, 632 in respective scan chain groups 620, 630. Such fanning out of the scan chains shorten the overall test duration in that the fanned out chains are shorter in length. Input data, such as from the ATE (not illustrated), is provided from the corresponding bidirectional pin 612, 614, fanned out into a pair of scan chains 622, 632, and response data is shifted out of the scan chains 622, 632 into a masking unit 640, which is described below in more detail. Selected data from the masking unit 640 proceeds to a signature processing unit 650, which forms a response signature in a suitable manner. The signature processing unit 650 may be, for example, a multiple-input signature register (MISR) in series with an XOR compression network, however, the present general inventive concept may be used with any evaluation process without deviating from the spirit and intended scope thereof. Further, whereas the circuit of FIG. 6 is illustrated as providing a response signature across bidirectional pin 612, 614, other test response indications may be implemented without deviating from the spirit and intended scope of the present general inventive concept.

The scan chains 622, 632 may be controlled by a scan chain control unit 660, which provides clock signals, instruction signals, and scanning signals to operate the scan chains 622, 632. The control signals, such as a test clock, a test mode activation signal, and one or more test instructions, may be provided to the scan chain control unit 660 from the ATE through access pins 616-618. The scan chain control unit 660 may derive the scan chain control signals, such as, among others, the shift data register (SHIFTDR) signal and clock data register (CLOCKDR) signal described below, from the control signals input on access pins 616-618.

The present general inventive concept is not limited to a particular control methodology for the scan chains 622, 632, and implementation details thereof will be omitted in the interest of brevity.

The exemplary masking unit 640 receives a stream of mask enable bits via access pin 619. In the exemplary embodiment illustrated in FIG. 6, the masking unit 640 blocks any response vector retrieved from the scan chain groups 620, 639 that contains an X-state from entering the signature processing unit 650. That is, the masking unit 640 establishes which response vectors are allowed to contribute to the determination of the fitness of the CUT. In accordance with the present embodiment of the present general inventive concept, the scan chains 622, 632 are to be reordered so that a minimal number of response vectors are masked by the masking unit 640 and, conversely, a maximal number of response vectors are allowed to pass into the signature processing unit 650 as evaluation vectors.

Figure 7A:
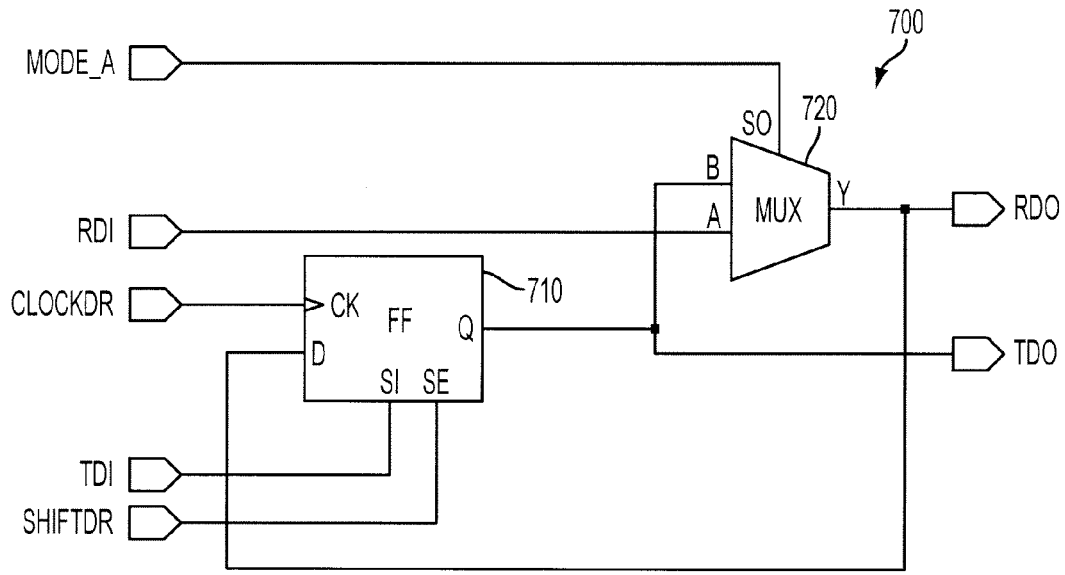
FIGS. 7A-7B are schematic block diagrams illustrating exemplary receiver and driver state retention cells, respectively, suitable to practice the present general inventive concept.
Figure 7B:
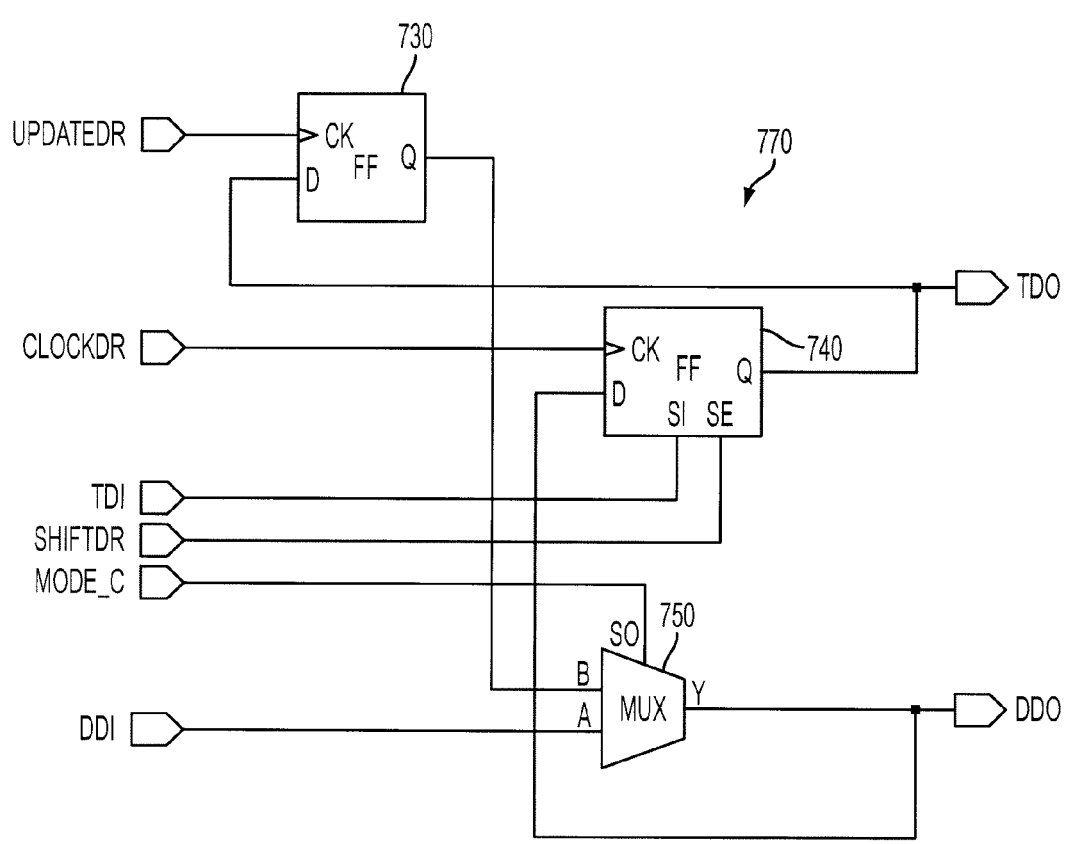

The scan chains 622, 632 may be constructed from state retention cells, or "scan cells," of one or more functional types. For example, FIG. 7A illustrates an exemplary receiver cell to couple to, for example, one of the input pads of an electrical circuit, and FIG. 7B illustrates an exemplary driver cell to couple to, for example, one of the output pins of the electrical circuit. Numerous cell configurations other than those illustrated in FIGS. 7A-7B may be utilized in embodiments of the present general inventive concept without deviating from the spirit and intended scope thereof. The operation of the exemplary cells, as well as an exemplary test cycle, are provided to exemplify various mechanisms involved in ordering of the cells according to the present general inventive concept, which is described in detail below.

Receiver cell 700 of FIG. 7A includes a multiplexer 720, which is operated by a signal on the MODE_A terminal, transparently provides data from an input pad coupled to the Receiver Data In (RDI) terminal to the internal application logic coupled to the Receiver Data Out (RDO) terminal. For purposes of explanation, it is to be assumed that the CUT is coupled to the RDI terminal of the exemplary receiver cell 700. When the MODE_A signal activates the multiplexer 720 into a test mode, a rising data register clock CLOCKDR provided to the flip-flop 710 captures the state on the RDO terminal, as received at the input pad coupled to the RDI terminal. Thus, whatever state is present on the input pad coupled to the RDI terminal is captured in the flip-flop 710 upon the activation of the CLOCKDR signal.

Shifting data along the scan chain occurs from the Test Data In (TDI) terminal to the Test Data Out (TDO) terminal. State retention elements are interconnected, or "stitched," from the TDO terminal of one element to the TDI terminal of a next terminal in the scan chain. Thus, when the shift data register (SHIFTDR) signal is active on the shift enable (SE) terminal of flip-flop 710, the data on the TDI terminal is transferred to the TDO terminal upon a rising edge of CLOCKDR by way of the serial input (SI) terminal of flip-flop 710, regardless of the state on the input pad coupled to the RDI terminal.

An exemplary driver cell 770 is illustrated in FIG. 7B, which includes a similar capture flip-flop 740 as is implemented by flip-flop 710 in the receiver cell 700. The multiplexer 750 of driver cell 770 is also similar in function to the multiplexer 720 of the receiver cell 700 in FIG. 7A. However, driver cell 770 may include an update flip-flop 730 to load a test bit onto a pad coupled to the Driver Data Out (DDO) terminal. For purposes of explanation, it is to be assumed that the CUT is coupled to the DDO terminal of the exemplary driver cell 770. Responsive to the signal MODE_C, the multiplexer 750 either loads the Driver Data In (DDI) onto the pad coupled to the DDO terminal, or the state retained by the update flip-flop 730, which is the previous value of the TDO bit at the output of the capture flip-flop 740.

As previously described, a scan chain is formed from the scan cells 700, 770 by stitching the TDO terminal of one cell to the TDI terminal of another cell. The scan cells 700, 770 are positioned at nodes in the circuit according to the function of the circuit at the corresponding node therein. For example, a driver cell 770 may be positioned at an output node of, for example, a logic circuit, and a receiver cell 700 may be positioned at an input node of the logic circuit. The response states corresponding to an input test data pattern are captured by the capture flip-flops 710 in the scan chain, and are physically ordered in the scan chain according to the position of the receiver cell 700 that captured the state relative to the position of other receiver cells 700 in the scan chain. The response states may be shifted through the scan chain from a TDO terminal of one cell to the TDI terminal of a cell to which the TDO terminal of the other cell is connected.

Using the exemplary scan cells of FIGS. 7A-7B, relevant portions of a test cycle will now be described. It is to be understood that the order in which the test operations are described may not be the order in which actual processes are performed.

A test pattern is shifted into a scan chain by passing bits from the TDO terminal of one cell to the TDI terminal of another cell. During this time, the scan chain control unit 660 may assert the SHIFTDR signal on each cell in the chain, and each TDI bit at a cell is transferred to the TDO terminal of the same cell at the rising edge of the CLOCKDR signal. MODE_A and MODE_C may at this time configure the multiplexers 720 and 750, respectively, to respectively couple the input A thereof to the output Y.

Once a test pattern is in place, each capture flip-flop 740 has at its output a single bit of the test pattern, at which time the controller 660 may toggle MODE_C to connect the output of the update flip-flop 730 to the DDO terminal. The scan chain controller 660 may then assert the UPDATEDR signal, and the test bit on the TDO terminal is thereby transferred to the DDO terminal, the pad coupled to the DDO terminal, and the portions of the CUT coupled to that pad.

The pad coupled to the DDO terminal may also be coupled to a pad coupled to the RDI terminal of a receiver cell 700 and, if the circuit elements are correctly installed and the interconnections thereof are conducting properly, a correct response bit is captured by the receiver cell. Otherwise, an incorrect response bit captured at the receiver cell 700 will indicate a defective circuit. To capture the response bits corresponding to the test pattern, the scan chain controller 660 operates the multiplexer 720, through the MODE_A signal, to couple the RDI terminal to the RDO terminal. The scan chain control unit 660 applies a CLOCKDR to the capture flip-flops 710, 740, which, at the receiver, captures a test response bit and, at the driver, captures the bit on the DDO terminal. The captured response can then be shifted out of the scan chain in a manner similar to the shifting operation described above. Additionally, several different scan chains may be synchronously clocked, for example, by SHIFTDR, to produce temporally aligned response vectors of states across the scan chains.

Receiver cells 700 in a scan chain may be ordered independently of the order of the driver cells 770. Consequently, for a fixed test pattern, the data captured in receiver cells 700 can be reordered into numerous different configurations without affecting the location in the CUT at which the results are captured for the applied test pattern. If the reordering of receiver cells is achieved by the interconnections between the TDI and TDO terminals in the scan chain, such as illustrated through the exemplary embodiment described below, response data shifted through the scan chain will be retrieved from the scan chain in the reordered format regardless of the spatial order in which the state retention cells are positioned in the CUT.

Referring now to FIG. 8A, there is illustrated a portion of a circuit bounded by a circuit boundary 810. As described above, the boundary 810 defines a region in which the circuit enclosed thereby is tested only through access to the embedded test circuit. For purposes of explanation only and not limitation, the description will proceed as if the boundary 810 encloses application logic 820 interconnected with circuitry external to the boundary (not illustrated) through circuit pads representatively illustrated at circuit pad 811. Further, it will be assumed that application logic 820 comprises the exemplary CUT.

The state retention cells (SRCs), representatively illustrated at SRCs 830, 840, and 850, are placed appropriately to test the CUT at a node thereat. The physical placement coordinates in the circuit layout may be maintained in the design database of the circuit, such as in database 580. By way of the placement of the SRCs, response states are captured in a physical order defined by the location of the SRC capturing the response state relative to the other SRCs in the chain. Once placed appropriately, the physical coordinates of individual state retention cells need not change to carry out the exemplary embodiment of the present general inventive concept, as will become apparent from the description below. However, the SRCs may be shifted in position to accommodate, for example, traces being routed by routing engine 570 as required by the design rules of the circuit, which, in certain embodiments of the present general inventive concept, can be achieved without altering the spatial order of the SRCs. It is to be understood that the state reordering according to the exemplary embodiment of the present general inventive concept is achieved without relocating the SRCs involved in the reordering.

Figure 8B:
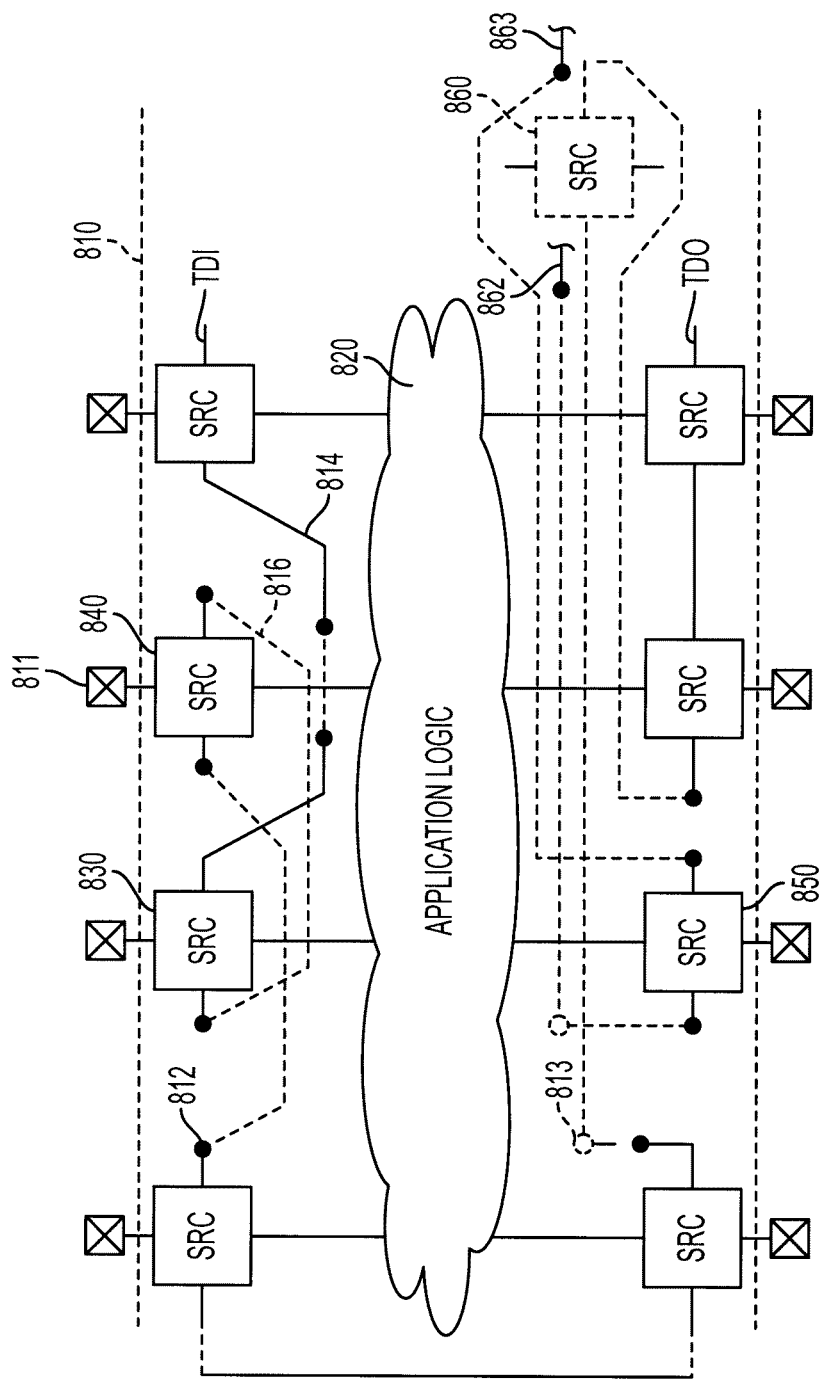

For purposes of providing a brief and clear explanation, the description of the interconnections of the SRCs will proceed as if all of the cells illustrated in FIGS. 8A-8B are receiver cells having an RDI terminal 824, an RDO terminal 823, a TDI terminal 825, and a TDO terminal 826. It is to be understood however that the test circuit will generally include driver cells to apply a test pattern to the CUT, but such driver cells have been omitted from FIGS. 8A-8B to avoid obscuring the features of the exemplary embodiment of FIGS. 8A-8B being described. Additionally, in certain embodiments of the present general inventive concept, pads of a circuit will have associated therewith both receiver cell circuitry and driver cell circuitry. For example, each pad may include a driver circuit, such as illustrated in FIG. 7B, to test logic internal to the boundary 810, and receiver circuitry, such as illustrated in FIG. 7A, to receive test data from another part of the circuit so that interconnections of various components in a broader circuit may be tested. Beneficially, the receiver cells can be stitched together without affecting the sequential order of the driver cells, and in portions of the circuit where reordering is not required, redundant circuit elements may be removed, and, where possible, components may be shared among driver and receiver circuits.

As illustrated in the FIG. 8A, once the SRCs have been placed, they are connected to the application logic 820 via interconnect lines representatively illustrated at reference numeral 822. The interconnections 822 are formed through the layout of the circuit by suitable pathfinding processes, such as by the routing engine 570. During a normal non-test operation, the SRCs will be transparent to the circuit, i.e., the RDI terminal will be directly coupled to the RDO terminal, such as through multiplexer 720 in FIG. 7A. Further, once an SRC has been connected to the application logic 820, the connection 822 need not be altered to carry out the exemplary embodiment of the present general inventive concept, although rerouting the connection 822 after the SRCs have been reordered in accordance with the present general inventive concept may be performed to meet certain design criteria, such as to minimize wire length cost or to meet timing requirements. However, it is to be understood that such alteration of connection 822 may be achieved without affecting the assignment of the terminals comprising the interconnection, i.e., the test node in the CUT may remain connected to the same SRC before and after an alteration to connection 822.

The SRCs are stitched from the TDO terminal of one SRC, for example, the SRC 840, to the TDI terminal of another SRC, for example, the SRC 830. The stitching may be a routing operation and may proceed according to one or more cost functions, while maintaining the design rules and constraints. A "cost," as used herein, refers to a measure of difficulty in implementing the routed interconnections between component terminals in a physical circuit, and is not necessarily the monetary cost of forming the interconnection. In certain embodiments of the present general inventive concept, the SRCs are ordered to minimize an SRC ordering cost function. The ordering cost in the exemplary embodiment is the level of difficulty to stitch the SRCs in a physically realizable circuit when the response states are to be retrieved in an order other than that in which the states were captured. The ordering cost function, when minimized, prescribes the "best" such order and may combine other cost functions that minimize, for example, a circuit interconnection cost, such as wire length, a testing cost, such as a number of evaluation vectors that contain X-states, and an SRC relocating cost, such as to stitch an SRC into a position at which another SRC provides a captured state, so that a new state can be inserted into the retrieval order. Other suitable cost functions will be apparent to the skilled artisan upon review of this disclosure.

Upon interconnection of the SRCs to the CUT, a state analysis may be performed, such as by state analyzer 590, to determine the location in the scan chains of the X-states. In certain embodiments of the general inventive concept, the position of the X-state in a scan chain is given as the stitched position of the capturing SRC relative to one end of the scan chain, such as the TDI end. It is to be understood that this relative position changes when the SRCs are stitched to reorder the captured response states. The state analyzer 590 may also determine the location in a scan chain of X-states relative to the locations of the X-states in other scan chains. This may be achieved by a suitable state tracing process, such as by logic cone analysis, although the present general inventive concept is not limited to any particular method by which the X-states are located in the scan chains. For example, logic cone analysis may reveal locations in the scan chain where a corresponding output of the application logic forming the CUT is indeterminate or inconsequential, and such outputs would be considered X-states in the scan chain.

Referring to FIG. 8A, it is to be assumed that the results of the state analysis evaluated by, for example, the processing engine 535, reveals that to reorder the captured response state at a minimized ordering cost, swapping the state positions of SRCs 830 and 840, and the state positions of SRCs 850 and 860, would align X-states in the illustrated scan chain with X-states in other scan chains. Further, in the illustrated example, the location of the response state captured by SRC 850 in the chain is to be occupied by the state captured by SRC 860, which may have been stitched into a separate scan chain. Certain embodiments of the present general inventive concept may allow such reordering to the extent provided for by the implementation of the ordering cost function. For example, if the ordering cost sets a higher precedence on the aligning of X-states to within a maximum wire length to achieve such alignment, then swapping locations with SRCs in other chains may result in a lower ordering cost. However, in other cases of those embodiments, when swapping with an SRC in another chain would exceed the maximum wire length, the swap is not executed, and other reordering options are explored.

Referring now to FIG. 8B, there is illustrated the scan chain of FIG. 8A as reordered in accordance with an exemplary embodiment of the present general inventive concept. In the present exemplary embodiment, the routing engine 570 has interconnected the SRCs in accordance with the reordering determined by the processing engine 535. By way of the illustrated interconnections, the conductive traces, such as illustrated representatively at 814 and 816, have been established by the routing engine 570 so that the states captured by SRCs 830 and 840 will be shifted out of the scan chain in a swapped order. Similarly, the traces 862 and 863 previously interconnecting SRC 860 in a first scan chain have been reconfigured so that SRC 860 reports its captured state in the order previously reported by SRC 850. It is to be understood that the interconnections illustrated in FIG. 8B are positioned so that the traces are clearly visible for purposes of description, and it is not intended to imply the positions of actual routed interconnections in the circuit.

The routing engine 570 may be a costed-wavefront router, which determines a path for the interconnection incrementally by starting at one terminal of the connection and deciding the direction of the next incremental path segment toward the other terminal by evaluating a cost function associated with the directional options at each increment. The cost function may be one that minimizes, for example, the overall wire length of the connection. As such, the routing engine 570 may choose to route the interconnections on an upper layer, such as illustrated at trace 814, or may introduce one or more vias in the path, such as is representatively illustrated at via 812, or even buried vias, such as illustrated at via 813, as required to interconnect that terminals to meet the minimum wire length cost. In certain embodiments of the present general inventive concept, such wire length cost may be incorporated into the overall ordering cost. For example, the processing engine 535 may evaluate the states provided by the state analyzer 590, and determine a retrieval order, i.e., a sequential order by which the response states are to be shifted out of one or more scan chains, that meets analysis criteria, such as, for example, minimizing a number of switching operations to mask X-state bits at a response analyzer. As discussed above, other ordering criteria are also possible, examples of which were described above and are further provided in the paragraphs that follow. In the instant example, the retrieval order is one criterion of the ordering cost that is to be met. Another criterion of the ordering cost may be that all of interconnections to achieve the retrieval order must have less than an overall wire length. In the exemplary embodiment, the retrieval order may be achieved by modifying the specification of the interconnection of terminals in the database 580, such as through reconfiguring a netlist of the circuit, and the wire length criteria may be achieved by the costed-wavefront router described above.

As demonstrated in FIG. 8B, the reordering of the states captured by SRCs may be achieved by rerouting the interconnections between the TDO terminal and the TDI terminal of the SRCs that are to be reordered such that an X-state in a scan chain is relocated in the scan chain shifting order. Such relocation of states may be used to locate X-states with respect to one another across multiple scan chains regardless of the alignment of the X-states when captured. For example, as is described below, the X-states of multiple scan chains may be ordered to be temporally aligned across the scan chains, such as to minimize the number of response vectors containing X-states.

Returning to FIG. 6, there is illustrated the masking unit 640 at the output of the scan chain groups 620, 630. The masking unit 640 may be provided with a stream of mask enable bits at terminal 619, such as from the ATE, to mask response vectors that contain X-states. Thus, the present general inventive concept may be embodied and utilized to reorder X-states so as to be aligned across multiple scan chains in common response vectors. The stream of mask enable bits may be formed to mask only those response vectors having X-states, which by way of exemplary embodiment of the present general inventive concept, are fewer in number. For example, a mask bit value of "1" may mask the response vectors that have been formed of only, or mostly of X-states, and a mask bit value of "0" may allow the response vectors void of X-states by way of the reordering to pass as evaluation vectors into the signature processing unit 650.

As illustrated in FIG. 4, prior to the state reordering 400, only two response vectors, indicated at response vectors 452 and 454, would remain unmasked, whereas after state reordering 400, all but three vectors 430, 431, and 432, would be unmasked. Thus, by way of the present general inventive concept, more response vectors are available to be analyzed as evaluation vectors. This translates to an improvement in test compression ratio (TCR), which can be defined as:

$$TCR = \frac{L_{fullscan}}{L_{compression}} \times \frac{N_{fullscan}}{N_{compression}} = \frac{L_{fullscan}}{L_{compression}} \times T_{effective},$$

where $L_{fullscan}$ is the length of the longest scan chain in a full scan configuration, $L_{compression}$ is the length of the longest scan chain in the compressed configuration, $N_{fullscan}$ is the number of test patterns required to complete testing of the CUT in the full scan configuration, $N_{compression}$ is the number of test patterns required to complete testing of the CUT in the compressed configuration, and $T_{effective} = N_{fullscan}/N_{compression}$ is the test effectiveness resulting from masking valid bits of response vectors. $T_{effective}$ is dependent on the alignment achieved by the exemplary embodiment of the present general inventive concept in that, as described above, if more valid states are aligned in a correspondingly increased number of evaluation vectors, such as achieved by the exemplary embodiment of the present general inventive concept described above, fewer test patterns are required to encompass the entire circuit test.

Table 1 below provides a numerical example of the improvement in test compression by way of the present general inventive concept.

TABLE 1

| DfT Implementation | Full Scan w/o compression | With Test Compression | With Test Compression and Scan Chain Reordering |
|---|---|---|---|
| Max. Flops/scan chain | 10,000 | 1000 | 1000 |
| Number of Test Patterns | 10,000 | 13,000 | 11,000 |
| Scan Shift Period | 100 ns | 100 ns | 100 ns |
| Test Application Time | 10 sec | 1 sec | 0.7 sec |
| $T_{effective}$ | 1 | 10,000/13,000 = 0.77 | 10,000/11,000 = 0.9 |
| Test Compression Ratio | N/A | 7.7X | 9X |

Figure 9:
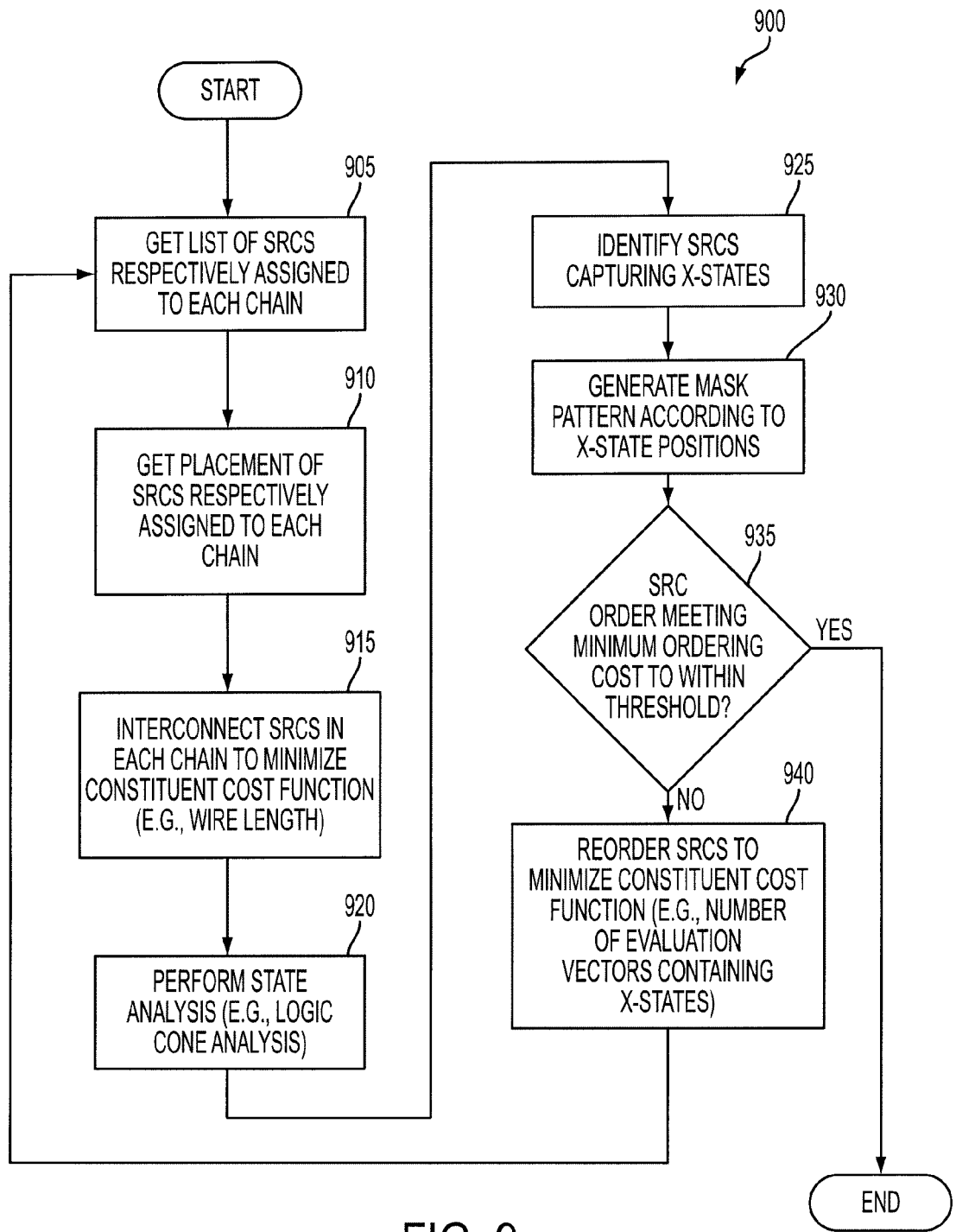
FIG. 9 is a flow diagram illustrating an exemplary method to reorder state retention cells in accordance with embodiments of the present general inventive concept.

FIG. 9 illustrates a flow diagram of an exemplary process 900 to carry out an embodiment of the present general inventive concept. In operation 905, a list of the SRCs in each chain is obtained from, for example, database 580. The assignment to respective chains of individual SRCs may be made by certain design criteria set by the designer. In operation 910, the coordinates of the SRCs and the layout are obtained from, for example, a layout definition file maintained in database 580. In operation 915, the SRCs are interconnected to minimize a constituent cost of the overall ordering cost, such as wire length. It is to be understood that other constituent costs may be evaluated concurrently with operation 915, or in a separate operation of process 900.

In operation 920, the state analyzer 590 analyzes the circuit to determine which of the SRCs capture X-states. As described above, the X-states may be determined from a state tracing process such as logic cone analysis. The SRCs that capture X-states, as determined by the analysis of operation 920, are identified in operation 925. In operation 930, a mask pattern may be generated in accordance with the location of the X-states across multiple scan chains. It is determined in operation 935 whether the SRCs are in an order that minimizes the ordering cost function to within a predetermined threshold. If so, the process 900 may be terminated and the current configuration of the scan chains is accepted as the configuration to physically embody in the circuit. If, however, it is determined that the SRCs are not ordered to minimize the ordering cost function to within the predetermined threshold, the SRCs are reordered to minimize another constituent cost of the ordering cost, such as the number of evaluation vectors containing X-states, or the cost of aligning the X-states across scan chains. In certain embodiments of the present general inventive concept, the reordering proceeds by examining neighboring SRCs to determine an order that would not require wire lengths longer than a predetermined maximum for the interconnections thereof. Once the reordering has been achieved, the process is reiterated at operation 905 to determine if any improvements can be made over the current ordering of the SRCs. In certain embodiments, the reiteration may be omitted, and a single pass of operation 900 may suffice. When so embodied, the process 900 may not be dependent upon reaching a specific ordering cost threshold, and, as such, operation 935 may be omitted, and the termination of process 900 may occur immediately after operation 940.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the medium.

It is to be understood that the computer-readable medium described above may be any medium on which the instructions may be encoded and then subsequently retrieved, decoded and executed by a processor, including electrical, magnetic and optical storage devices, and wired, wireless, optical and acoustical communication channels. The computer readable medium may include either or both of persistent storage, referred to herein as "computer-readable recording media" and as spatiotemporal storage, referred to herein as "computer-readable transmission media". Examples of computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

The descriptions above are intended to illustrate possible implementations of the present invention and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalence.

What is claimed is:

1. An electrical circuit comprising:
   a plurality of state capture elements to separately capture respective response states from a circuit portion under test;
   a plurality of other state capture elements to separately capture other respective response states from the circuit under test;
   a control unit; and
   an interconnection network selectively configured responsive to the control unit to adaptively inter-couple the state capture elements and the other state capture elements to form a plurality of serial shift registers optimally reordering the captured response states, wherein at least one set of response states captured from the circuit portion under test into the serial shift registers in a first alignment with respect to one another are shifted out of the serial shift registers reordered to a second alignment with respect to one another.

2. The electrical circuit as recited in claim 1, wherein the state capture elements are arranged in a plurality of scan chains disposed in a first scan chain group, and the other state capture elements are arranged in a plurality of scan chains disposed in a second scan chain group.

3. The electrical circuit as recited in claim 2, further comprising a scan chain control unit coupled to the scan chains in each of the first and second scan chain groups; the scan chain control unit being operable to apply control signals to the scan chains of the first and second scan chain groups for selectively reordering the state capture elements and other state capture elements thereof.

4. The electrical circuit as recited in claim 3, further comprising a masking unit coupled to the shift registers, the masking unit being operable to selectively mask each of the shift registers.

5. The electrical circuit as recited in claim 4, further comprising a signature processing unit coupled to the masking unit, the signature processing unit formulating response signatures from the states captured in the shift registers remaining unmasked by the masking unit.

6. The electrical circuit as recited in claim 5, further comprising a plurality of bidirectional pins each coupled to corresponding ones of the scan chains in the first and second scan chain groups, and to the signature processing unit.

7. The electrical circuit as recited in claim 3, wherein at least a portion of the state capture elements are configured as receiver cells disposed at an input node of application logic in a circuit under test, the receiver cells each being coupled between a test data in (TDI) terminal and a test data out (TDI) terminal, the receiver cell being alternatively operable in a test mode and a shift data mode.

8. The electrical circuit as recited in claim 7, wherein each receiver cell includes a capture flip-flop device and a multiplexer device coupled thereto;

the capture flip-flop device being operable in the test mode to capture data received at an input pad for delivery to the application logic of the circuit under test, and being operable in the shift data mode to transfer data received at the TDI terminal to the TDO terminal; and, the multiplexer device being operable to selectively apply the test and shift data modes to capture flip-flop.

9. The electrical circuit as recited in claim 3, wherein at least a portion of the state capture elements are configured as driver cells disposed at an output node of application logic in a circuit under test, the driver cells each being coupled between a test data in (TDI) terminal and a test data out (TDI) terminal, the driver cell being alternatively operable in first, second, and third modes.

10. The electrical circuit as recited in claim 9, wherein each driver cell includes an update flip-flop device, a capture flip-flop device, and a multiplexer device coupled to each of the update and capture flip-flop devices;

the capture flip-flop device being operable in the first mode to capture data received at an output pad coupled to the application logic of the circuit under test, and being operable in the second mode to transfer data received at the TDI terminal to the TDO terminal;

the update flip-flop being operable in the third mode to load test data onto the output pad;

the multiplexer device being operable to selectively apply the first, second, and third modes to the capture and update flip-flops.

11. A method for integrating a test system in an electrical circuit comprising:

establishing an electrical circuit having an arrangement of interconnected electrical circuit portions;

placing a plurality of state capture elements in said electrical circuit to separately capture respective response states from a circuit portion under test;

placing a plurality of other state capture elements in said electrical circuit to separately capture respective other response states from the circuit portion under test; and executing a computer processor for selectively configuring an interconnection network to adaptively inter-couple the state capture elements and the other state capture elements to form a plurality of serial shift registers optimally reordering the captured response states, wherein the at least one set of response states captured from the circuit portion under test into the serial shift registers in a first alignment with respect to one another are shifted out of the serial shift registers reordered to a second alignment with respect to one another.

12. The method as recited in claim 11, wherein the state capture elements are arranged to form a plurality of scan chains disposed in a first scan chain group, and the other state capture elements are arranged in a plurality of scan chains to form a second scan chain group.

13. The method as recited in claim 12, further comprising establishing a scan chain control unit in said electrical circuit to be coupled to the scan chains in each of the first and second scan chain groups; and, actuating the scan chain control unit to apply control signals to the scan chains of the first and second scan chain groups for selectively reordering the state capture elements and other state capture elements thereof.

14. The method as recited in claim 13, further comprising establishing a masking unit in said electrical circuit to be coupled to the shift registers; and, actuating the masking unit to selectively mask each of the shift registers.

15. The method as recited in claim 14, further comprising establishing a signature processing unit in said electrical circuit to be coupled to the masking unit; and, actuating the signature processing unit to formulate response signatures from the states captured in the shift registers remaining unmasked by the masking unit.

16. The method as recited in claim 15, further comprising establishing in said electrical circuit a plurality of bidirectional pins each coupled to corresponding ones of the scan chains in the first and second scan chain groups, and to the signature processing unit.

17. The method as recited in claim 13, wherein at least a portion of the state capture elements are configured as receiver cells disposed at an input node of application logic in a circuit under test, the receiver cells each being coupled between a test data in (TDI) terminal and a test data out (TDI) terminal, the receiver cell being alternatively operable in a test mode and a shift data mode.

18. The method as recited in claim 17, wherein a capture flip-flop device and a multiplexer device are coupled to each receiver cell;

alternatively actuating the capture flip-flop device in the test mode to capture data received at an input pad for delivery to the application logic of the circuit under test, and in the shift data mode to transfer data received at the TDI terminal to the TDO terminal; and, actuating the multiplexer device to selectively apply the test and shift data modes to capture flip-flop.

19. The method as recited in claim 13, wherein at least a portion of the state capture elements are configured as driver cells disposed at an output node of application logic in a circuit under test; and, the driver cells are each coupled between a test data in (TDI) terminal and a test data out (TDI) terminal; the driver cell being alternatively operated in first, second, and third modes.

20. The method as recited in claim 19, wherein each driver cell is provided with an update flip-flop device, a capture flip-flop device, and a multiplexer device coupled to each of the update and capture flip-flop devices;

actuating the capture flip-flop device in the first mode to capture data received at an output pad coupled to the application logic of the circuit under test, and in the second mode to transfer data received at the TDI terminal to the TDO terminal;

actuating the update flip-flop in the third mode to load test data onto the output pad;

actuating the multiplexer device to selectively apply the first, second, and third modes to the capture and update flip-flops.

\* \* \* \* \*

UNITED STATES PATENT AND TRADEMARK OFFICE
CERTIFICATE OF CORRECTION

PATENT NO. : 8,584,074 B1  
APPLICATION NO. : 12/987348  
DATED : November 12, 2013  
INVENTOR(S) : Thirunavukarasu et al.

Page 1 of 1

It is certified that error appears in the above-identified patent and that said Letters Patent is hereby corrected as shown below:

In the Claims:

Claim 7, Col. 16, Line 62, "test data out (TDI)" should read --test data out (TDO)--.

Claim 9, Col. 17, Line 12, "test data out (TDI)" should read --test data out (TDO)--.

Claim 17, Col. 18, Line 23, "test data out (TDI)" should read --test data out (TDO)--.

Claim 19, Col. 18, Line 40, "test data out (TDI)" should read --test data out (TDO)--.

Signed and Sealed this  
Eighteenth Day of February, 2014

Michelle K. Lee  
*Deputy Director of the United States Patent and Trademark Office*